United States Patent [19]

Ueyama et al.

[11] Patent Number: 5,010,451
[45] Date of Patent: Apr. 23, 1991

[54] ELECTRONIC DEVICE

[75] Inventors: Satoshi Ueyama; Hiroaki Kawakubo; Satoru Isoda; Mitsuo Maeda, all of Hyogo, Japan

[73] Assignee: Mitsubishi Denki K.K., Tokyo, Japan

[21] Appl. No.: 500,347

[22] Filed: Mar. 28, 1990

[30] Foreign Application Priority Data

Mar. 29, 1989 [JP] Japan .................................. 1-79236
Mar. 29, 1989 [JP] Japan .................................. 1-79237
Mar. 31, 1989 [JP] Japan .................................. 1-81827

[51] Int. Cl.$^5$ .......................... H01G 9/02; B32B 7/02; A01N 43/38
[52] U.S. Cl. .................................. 361/504; 514/410; 428/212
[58] Field of Search ................ 361/504, 323; 428/212; 540/145; 307/450; 514/410

[56] References Cited

U.S. PATENT DOCUMENTS

| 4,613,541 | 9/1986 | Isoda | 428/212 |
| 4,764,415 | 8/1988 | Isoda | 428/212 |
| 4,764,416 | 8/1988 | Ueyama | 428/212 |
| 4,783,605 | 11/1988 | Tomisawa et al. | 307/450 |
| 4,849,207 | 7/1989 | Sakata et al. | 514/410 X |

OTHER PUBLICATIONS

Journal American Chemical Society, 1989, vol. III, pp. 1099–1155, "Chemically Induced Release of Charge from a Rectifying Polymer Based on Viologen and Quinone Subunits", Smith et al.

Journal American Chemical Society, 1985, vol. 107, pp. 7373–7380, "A Microelectrochemical Diode and Submicron Contact Spacing Based on the Connection of Two Microelectrodes Using Dissimilar Redox Polymers", Kittlesen, et al.

Primary Examiner—Donald A. Griffin
Attorney, Agent, or Firm—Sughrue, Mion, Zinn, Macpeak & Seas

[57] ABSTRACT

Disclosed herein is an electronic device including a redox electrical element formed with redox materials such as a flavin derivative and a porphyrin derivative. The size of this electronic device can be reduced to a hyperfine level. By utilizing this electronic device, furthermore, a high-speed integrated circuit of high density can be obtained.

12 Claims, 4 Drawing Sheets

ELECTRONIC DEVICE

FIELD OF THE INVENTION

This invention relates to an electronic device used in the field of integrated circuits. More particularly, it relates to an electronic device which is used in hyperfine size (of several 10 to several 100 Å) in molecular level by using oxidation-reduction substances as material thereof, thereby attaining a high-speed integrated circuit of high density.

BACKGROUND OF THE INVENTION

Among electronic devices, field-effect transistors (FET), as shown in FIG. 5, have been employed heretofore as switch elements in conventional integrated circuits. In FIG. 5, the reference numeral 12 designates an n-type silicone substrate, 13 designates a channel region, 14 designates a P+layer, 15 designates $SiO_2$ films, 16 designates a source electrode, 17 designates a gate electrode and 18 designates a drain electrode. The transistor function or switching function of a FET of above conventional type may be attained by controlling a gate voltage to be applied via the gate electrode 17. Namely, a number of the current carriers on the surface layer between the source electrode 16 and the drain electrode 18 is varied depending on the gate voltage to thereby control the current.

An example of a conventional rectifier element for integrated circuits has a MOS structure as shown in FIG. 6, for example, as described in an article by Hisayoshi Yanai and Yuzuru Nagata, entitled "INTEGRATED CIRCUIT ENGINEERING (1)". In FIG. 6, the reference numeral 11 designates a p-type silicon substrate, 12 designates an n-type region, 13 designates a p-type region, 14 designates an n-type region, 15 designates $SiO_2$ films and 16 and 17 designate each an electrode. A p-n junction (i.e., a junction between the p-type region 13 and the n-type region 14) is formed between these two electrodes so as to attain rectifying characteristics.

The conventional MOS structure electronic device, being designed as described above, can be finely machined and a 256 K-bit LSI, wherein switch elements, rectifier elements or transistor elements similar in structure thereto, has been put into practical use.

In order to increase the memory capacity and the operation speed of an integrated circuit, it is essential to reduce the size of its elements per se. However, for instance, an element using Si has the limitation that, in an extremely fine pattern of the order of 0.2 μm, the average free path of electrons is substantially equal to the size of the element and the independence of the element can no longer be held. Thus, it can be expected that the silicon technology developing day by day will run into a blank wall when reducing the element size. Therefore, there has been a strong demand for provision of a novel electrical circuit device which can break the technological barrier of 0.2 μm mentioned above.

Under these circumstances, the present invention aims at providing an electronic device which comprises oxidation-reduction substances as materials so as to reduce the size thereof to the hyperfine molecular level.

On the other hand, a plurality of types of biogenic proteins (hereinafter referred to as electron transport proteins) having electron transport functions for carrying electrons in predetermined directions are present in vivo. For example, the electron transport biogenic proteins are embedded in biomembranes in regular orientation, to be in a specific intermolecular arrangement so that electron transport is caused between biomolecules.

The electron transport biogenic proteins show oxidation-reduction (redox) reactions in electron transport in vivo and are capable of making electrons flow from negative redox potential levels to positive redox potential levels. Hence it may be considered that the movement of the electrons can be controlled in molecular level by utilizing such properties of the electron transport proteins.

A recent study suggests that it is possible to form electron transport complexes by combining electron transport biogenic proteins with electron transport non-biogenic substances other than the electron transport biogenic proteins present in vivo.

Therefore, it may be considered that a junction having rectifying characteristics can be formed by accumulating two types of electron transport substances A and B, which are suitably selected to be different in redox potential from each other, in two layers in the form of A-B. The present inventors have completed the present invention based on this consideration.

SUMMARY OF THE INVENTION

According to the present invention there is provide an electronic device comprising:

a first oxidation-reduction substance film of a first oxidation-reduction substance;

a second oxidation-reduction substance film of a second oxidation-reduction substance having a redox potential different from that of said first oxidation-reduction substance and being accumulatedly sticked and joined on said first oxidation-reduction substance film; and a first electrode electrically connected to said first oxidation-reduction substance film and a second electrode electrically connected to said second oxidation-reduction substance film;

wherein said first oxidation-reduction substance is composed of one of a flavin derivative and a porphyrin derivative while said second oxidation-reduction substance is composed of another one so as to provide transistor characteristics or switching characteristics by utilizing the difference in redox potential between said first and second oxidation-reduction substances (hereinafter referred to as the A-B type device).

The present invention further relates to an electronic device comprising:

a first oxidation-reduction substance film of a first oxidation-reduction substance;

a second oxidation-reduction substance film of a second oxidation-reduction substance having a redox potential different from that of said first oxidation-reduction substance and being accumulatedly sticked and joined on said first oxidation-reduction substance film;

A third oxidation-reduction substance film of a third oxidation-reduction substance having a redox potential different from that of said second oxidation-reduction substance and accumulatedly sticked and joined on said second oxidation-reduction substance film;

a first electrode electrically connected to said first oxidation-reduction substance film and a third electrode electrically connected t said third oxidation-reduction substance film; and a second electrode for exerting electrical effects on said second oxidation-reduction substance film;

wherein said first oxidation-reduction substance is composed of a flavin derivative, said second oxidation-reduction substance is composed of a porphyrin derivative and said third oxidation-reduction substance is composed of a flavin derivative;

or said first oxidation-reduction substance is composed of a porphyrin derivative, said second oxidation-reduction substance is composed of a flavin derivative and said third oxidation-reduction substance is composed of a porphyrin derivative so as to provide transistor characteristics or switching characteristics by utilizing the difference in redox potential among said oxidation-reduction substances (hereinafter referred to as the A-B-A type device).

BRIEF DESCRIPTION OF THE DRAWINGS

FIG. 2(a) is a typical diagram showing an A-B type oxidation-reduction substance complex while

FIG. 3(a) is a typical diagram showing an A-B-A type oxidation-reduction substance complex, FIG. 3 (b) is a typical diagram showing voltage application states of said A-B-A type electronic device while

DETAILED DESCRIPTION OF THE INVENTION

The present invention is characterized in that transistor characteristics or switching characteristics can be attained by using at least two oxidation-reduction substances differing in redox potential from each other.

Figure 2A:
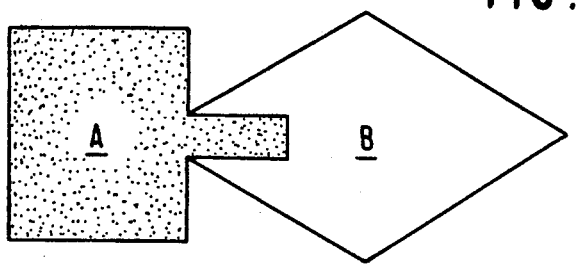
Figure 2B:
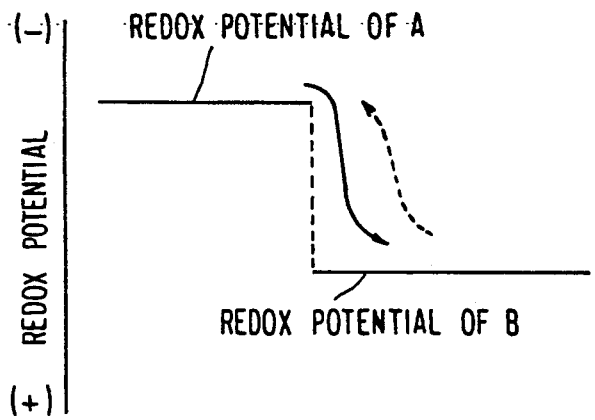
FIG. 2(b) is a diagram showing redox potential states thereof.

Referring to FIGS. 2(a) and 2(b) which show a model of an A-B type oxidation-reduction substance complex and the relation of the redox potential thereof, in the complex prepared by joining oxidation-reduction substances A and B having different redox potentials, electrons can easily flow from the negative redox potential level to the positive redox potential level while the electrons can hardly flow in the reverse direction (of the broken line arrow in the drawing). The redox potential of the oxidation-reduction substance A or B can be varied by photoirradiation. Namely, the difference in redox potential between the oxidation-reduction substances A and B would vary before and after the photoirradiation. This change corresponds to a change in the electron transport speed from the oxidation-reduction substance A to the oxidation-reduction substance B or vice versa and thus is accompanied by a change in electric conductivity, thus giving switching characteristics.

Figure 3A:
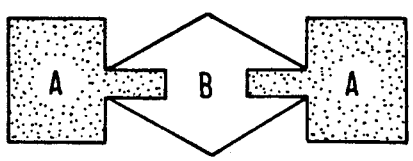
Figure 3B:
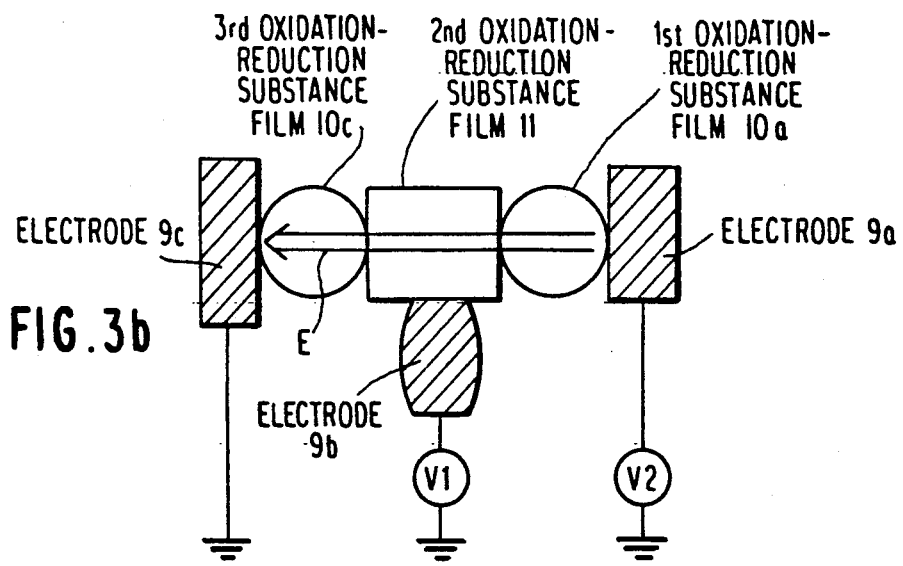
Figure 3C:
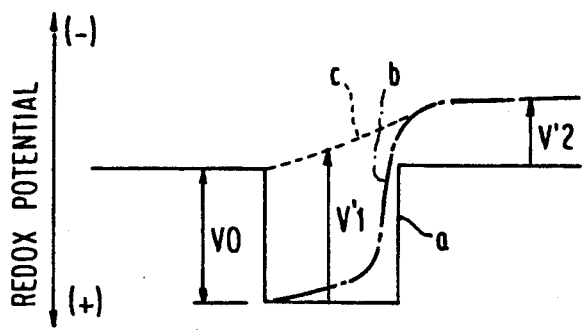
FIG. 3(c) is a diagram showing redox potential states thereof.

Referring to FIGS. 3(a) to 3(c) which show a model of an A-B-A type oxidation-reduction substance complex and the relation in redox potential thereof, in the complex prepared by joining the oxidation-reduction substances in the form of A-B-A, the redox potential distribution of the three oxidation-reduction substances A, B and A can be changed by controlling a voltage applied to the oxidation-reduction substance A or B or changing the structures of the oxidation-reduction substances by exposing them to light or a magnetic field, or applying a mechanical force thereto. Thus it is expected to obtain an element having transistor characteristics or switching characteristics similar to those of a p-n-p junction prepared by combining an n-type and p-type semiconductors.

As the oxidation-reduction substances to be used in the present inventions, flavin derivatives and porphyrin derivatives may be selected since these substances, which are pseudo-biomembrane substances, might cause stable oxidation-reduction reactions and show high electron transport speed.

Examples of said flavin derivatives are compounds represented by the following formula (I):

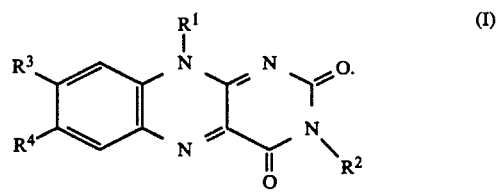

In the above formula (I), $R^1$ and $R^2$ are each a hydrogen atom or an alkyl group selected from among the following combinations:

(i) $R^1$ is a hydrogen atom or an alkyl group having 1 to 5 carbon atoms and $R^2$ is an alkyl group having 15 to 20 carbon atoms;

(ii) $R^1$ is an alkyl group having 6 to 20 carbon atoms and $R^2$ is an alkyl group having 6 to 20 carbon atoms; and (iii) $R^1$ is an alkyl group having 15 to 20 carbon atoms and $R^2$ is a hydrogen atom or an alkyl group having 1 to 5 carbon atoms.

Since the $R^1$ and $R^2$ groups are selected from among the above-mentioned combinations, the polarity of the compound can be controlled, which makes it possible to form a uniform mono-molecular film on the surface of water.

On the other hand, $R^3$ and $R^4$ represent each a hydrogen atom, an alkyl group having 1 to 5 carbon atoms, a substituent including a carbonyl group, a methylthioacetate group or a methylthiosuccinate group. Since the $R^3$ and $R^4$ groups represent the above-mentioned ones, the number of anions per molecule of the compound can be varied, namely, 0, 1 or 2. Further the position of an isoalloxazine ring in a monomolecular film can be controlled thereby. Furthermore, the orientation of the isoalloxazine ring in the monomolecular film can be controlled thereby.

Preferable examples of said flavin derivatives are as follows:

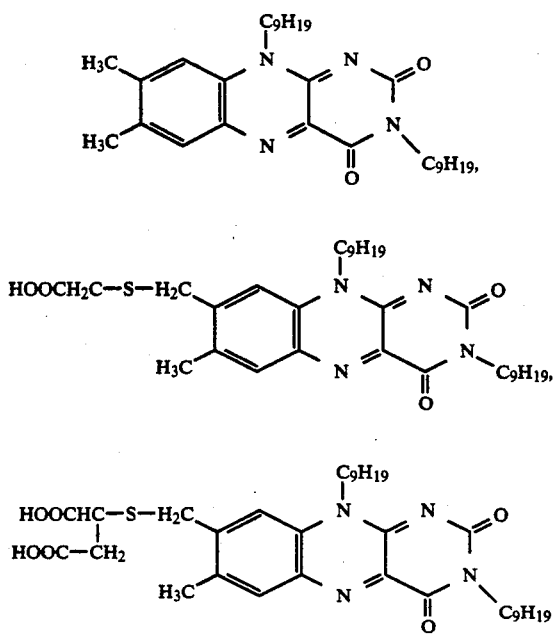

Examples of the above-mentioned porphyrin derivatives include compounds represented by the following formulae (II), (III) and (IV):

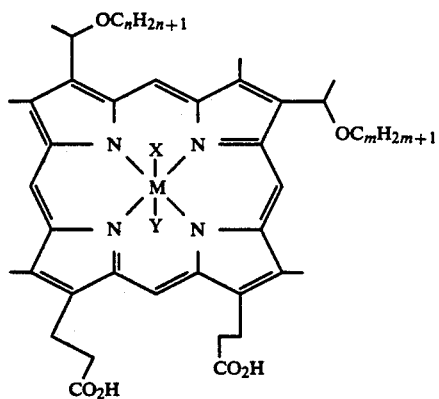
(II)

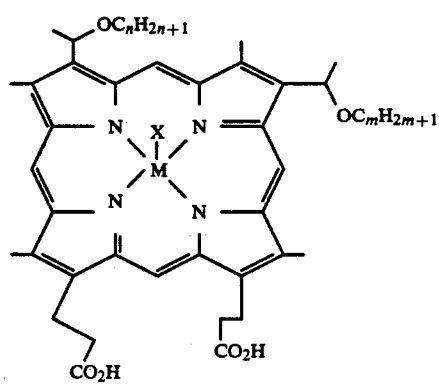
(III)

and

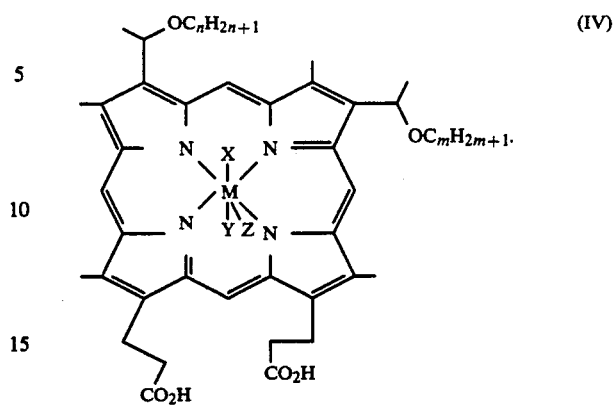
(IV)

In the above formulae (II) to (IV), M represents a Fe or Ru atom. Since M is a Fe or Ru atom, an oxidation-reduction reaction between divalent and trivalent states can stably proceed.

In the above formulae (II) to (IV), X, Y and Z represent each a halogen atom, CO, —OCOCH$_3$, pyridine, imidazole, P(OR)$_3$ or PR$_3$ group, wherein R represents a lower alkyl group having 1 to 4 carbon atoms. When X, Y and Z represent neither these atoms nor these groups, the stabilities in the divalent or trivalent states are lowered and thus the compound would be easily deteriorated. X and Y may be either the same or different from each other.

In the above formulae (II) to (IV), m and n represent each an integer of from 5 to 20, preferably from 5 to 15. When m or n is less than 5, the compounds of the formulae (II) to (IV) show insufficient hydrophobic properties. In this case, it is impossible to form a monomolecular film suitable for the formation of an LB film. When m or n exceeds 20, on the other hand, the hydrophoic alkyl chains in the compounds of the formulae (II) to (IV) become excessively long. In this case, the interlayer distance between porphyrin rings becomes too long upon the formation of a monomolecular accumulated film. Thus the electron transfer properties are deteriorated. M and n may be either the same or different from each other.

An alkali metal salt of a porphyrin metal complex is an alkali metal salt of each compound represented by the formulae (II) to (IV). Examples of said alkali metal include sodium and potassium. Either one or two of the carboxyl groups in the formulae (II) to (IV) may be converted into a salt.

Preferable examples of said porphyrin derivatives are as follows:

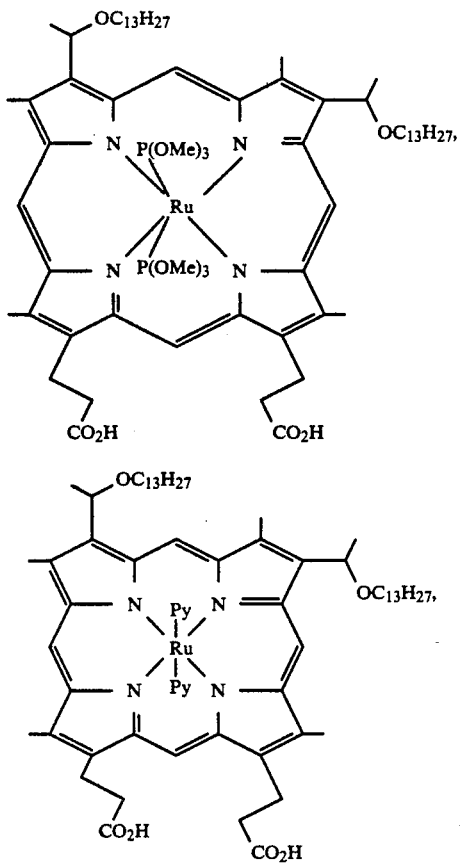

wherein Py represents a pyridine group; and

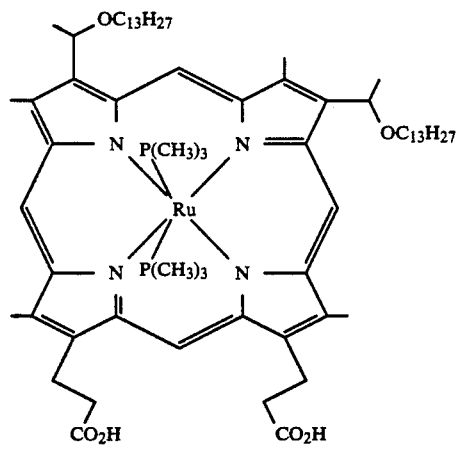

Now an A-B type switch device, i.e., an embodiment of the present invention, having a two-layer oxidation-reduction substance film will be described.

In the case of this switch device, either the flavin derivative or the porphyrin derivative, as described above, is used as the first oxidation-reduction substance while another one is used as the second oxidation-reduction substance. It is preferable that the difference in the redox potential of these oxidation-reduction substances ranges from 0.3 to 1.0 V, from the viewpoints of increasing the electron transport speed and elevating the photoelectric transduction efficiency.

The first and second oxidation-reduction substance films prepared from the above-mentioned oxidation-reduction substances may preferably have each a thickness of from 10 to 500 Å, still preferably from 10 to 100 Å, from the viewpoints of shortening the electron transport time and increasing the response speed of the device.

These films may be prepared by, for example, Langumuir-Blodgett (LB) method, molecular beam epitaxis (MBE) method or chemical vapor deposition (CVD) method. In order to accumulate the monomolecular films of organic molecules while sustaining the stable structures thereof, it is preferable to use a monomolecular film or an accumulated film consisting of 2 to 10 layers prepared by the LB method. Studies by the present inventors indicate that the orientation of a film prepared by the LB method can be controlled by adjusting the thickness of the film upon the film-formation and that both of a flavin LB film and a porphyrin LB film show excellent orientation when the thickness thereof is controlled within a range of from 25 to 32.5 $mN \cdot m^{-1}$.

Figure 1:
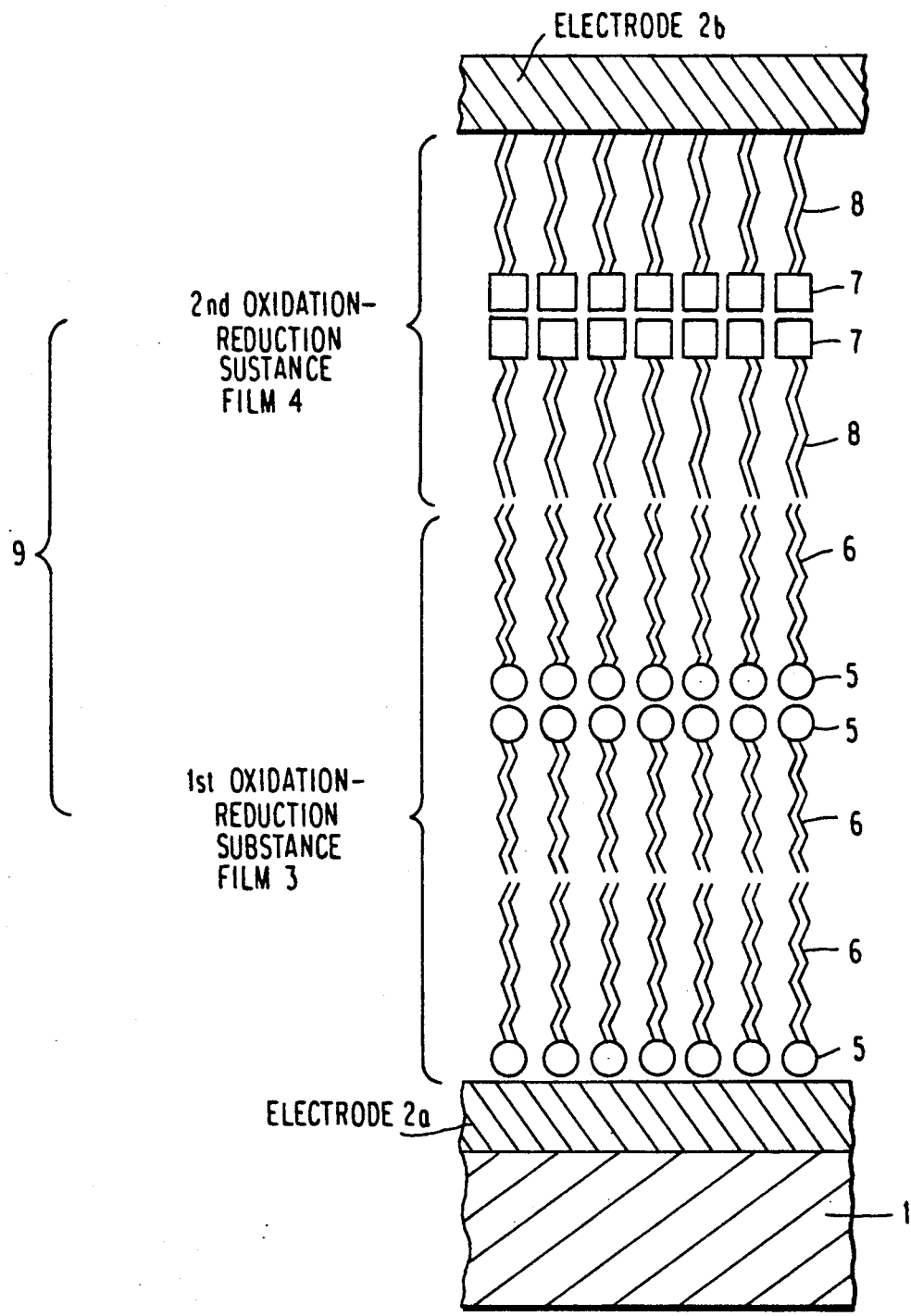
FIG. 1 is a typical sectional view showing the structure of an electronic device according to an embodiment of the present invention.

FIG. 1 shows an example of the above-mentioned A-B type switch device.

FIG. 1 is a typical sectional view showing said switch device. In the drawing, the reference numeral designates a substrate, for example, a glass substrate having insulating characteristics, the reference numerals (2a) and (2b) respectively designate first and second electrodes and the reference numeral (3) and (4) respectively designate first and second oxidation-reduction substance films. In this embodiment, the first oxidation-reduction substance film (3) is a monomolecular accumulated film of a porphyrin derivative prepared by the LB method and the reference numeral (5) designates hydrophilic porphyrin rings part while the reference numeral (6) designates hydrophobic methylene chains. The second oxidation-reduction substance film (4) is a monomolecular accumulated film of a flavin derivative prepared by the LB method and the reference numeral (7) designates hydrophilic isoalloxazine rings while the reference numeral (8) designates hydrophobic methylene chains. The second oxidation-reduction substance film (4) is accumulatedly contacted and joined on the first oxidation-reduction substance film (3).

The above-mentioned electrodes, which are provided in order to apply a definite voltage between said oxidation-reduction substance films, are generally selected from among metallic electrodes (for example, Ag, Au, Al) and transparent electrodes (for example, $SnO_2$, ITO). The accumulated contact and join as used herein can be easily formed by preparing the first oxidation-reduction substance film by the LB, MBE or CVD method and subsequently preparing the second oxidation-reduction substance film by, for example, the LB method thereon. The light to be used in the photoirradiation may be selected in such a manner as to give the wavelength at which the first or second oxidation-reduction substance film would show light absorption. In the case of a flavin derivative, for example, the wavelength of the light may range from 250 to 520 nm. The photoirradiation can be conducted in a conventional manner, without restriction.

Now an A-B-A type switch device, i.e., an embodiment of the present invention, having a three-layer oxidation-reduction substance film will be described.

This switch device comprises:

(i) a flavin derivative used as a first oxidation-reduction substance, a porphyrin derivative used as a second oxidation-reduction substance and a flavin derivative used as a third oxidation-reduction substance; or (ii) a porphyrin derivative used as a first oxidation-reduction substance, a flavin derivative used as a second oxidation-reduction substance and a porphyrin derivative used as a third oxidation-reduction substance.

The difference in the redox potential of the first or third oxidation-reduction substance and the second oxidation-reduction substance may preferably range from 0.3 to 1.0 V, form the viewpoints of increasing the electron transport speed and elevating the photoelectric transduction efficiency.

The first, second and third oxidation-reduction substance films prepared from the above-mentioned oxidation-reduction substances may preferably have each a thickness of from 10 to 500 Å, still preferably from 10 to 100 Å, from the viewpoints of shortening the electron transport time and increasing the response speed of the device. Similar to the case of the above-mentioned switch device having a two-layer oxidation-reduction substance film, these films may be prepared by, for example, Langumuir-Blodgett (LB) method, molecular beam epitaxis (MBE) method or chemical vapor deposition (CVD) method. It is preferable to use a monomolecular film or an accumulated film consisting of 2 to 10 layers prepared by the LB method.

FIG. 3(b) shows an embodiment of the above-mentioned A-B-A type switch device controlled by electric field.

In the drawing, a first oxidation-reduction substance film (10a) is accumulatedly sticked and joined onto one surface of a second oxidation-reduction substance film (11) while a third oxidation-reduction substance film (10c) is accumulatedly contacted and joined on another surface of the second oxidation-reduction substance film (11). Then the first and third oxidation-reduction substance films (10a) and (10c) are respectively electrically connected to electrodes (9a) and (9c). An electrode (9b) exerts electrical effects on the first oxidation-reduction substance film (11). That is to say, it is provided in order to change the redox potential of the oxidation-reduction substance film (11) by electric field.

Referring to FIGS. 3(b) and 3(c), a condition wherein a voltage is applied to the A-B-A type switch device and redox potential states in this condition will be described. In FIG. 3(c), lines indicate redox potential states (a) before voltages (V$_1$) and (V$_2$) are applied. Dot-and-dash lines indicate redox potential states (OFF states) (b) when the voltage V$_1$ is not applied but the voltage V$_2$ is applied as a negative voltage with respect to the electrodes (2c). Dot lines indicate redox potential states (ON states) (c) when the voltage V$_2$ is applied in the similar manner to the state (b) and the voltage V$_1$ is applied as a negative voltage with respect to the electrodes (2c). (E) designates an electron transmission pathway.

In the states (b), no electron flows between the electrodes (9c) and (9a). In the states (c), electrons flow therebetween. That is, a predetermined negative value of the voltage V$_2$ is applied between the electrodes (9c) and (9b), the ON-OFF operation of a current between the electrodes (9c) and (9b) can be controlled by the ON-OFF operation of a predetermined negative voltage V$_1$ between the electrodes (9c) and (9a). Thus switching characteristics can be attained. In the drawing, the symbol V$_0$ denotes a redox potential difference between the flavin derivatives (10a) and (10c) and the porphyrin derivative (11).

Now an examples of a process for the production of the switch device of the present invention will be described.

The A-B type switch device of the present invention may be produced as follows. First, electrodes are formed on a substrate by, for example, ion beam method, molecular beam method, deposition method or CVD method. Next, a first oxidation-reduction substance film is formed by, for example, the LB method in such a manner as to come into contact with the electrodes. Further, a second oxidation-reduction substance film is formed thereon by, for example, the LB method. Then electrodes are formed in such a manner as to come into contact with the upper oxidation-reduction substance film so as to give an A-B type switch device. On the other hand, an A-B-A type switch device of the present invention may be produced as follows. For example, first and second oxidation-reduction substance films are prepared in the same manner as the one described in the production of the A-B type switch device. Next, a third oxidation-reduction substance film is formed thereon by, for example, the LB method.

Now a rectifier element, wherein an A-B type oxidation-reduction substance complex is used, showing characteristics similar to those of a p-n junction will be described.

FIG. 1 is a typical sectional view showing a rectifier element of an embodiment of the present invention. In the drawing, the reference numeral (1) designates a substrate having insulation characteristics, the reference numerals (2a) and (2b) respectively designate first and second electrodes and the reference numerals (3) and (4) respectively designate first and second oxidation-reduction substance films. In this embodiment, the first oxidation-reduction substance film (3) is a monomolecular film of 3,10-dinonyl-7,8-dimethylisoalloxazine (hereinafter referred to as DNI) produced by the LB method (hereinafter referred to as LB film), the reference numeral (5) designates isoalloxazine rings and the reference numeral (6) designates hydrophobic nonyl groups. On the other hand, the second oxidation-reduction substance film (4) is made of cytochrome c. In this case, the redox potential of the first oxidation-reduction substance is approximately 400 mV, compared with that of the second oxidation-reduction substance, and thus rectifying characteristics as shown in FIG. 3 are achieved due to the difference in redox potential between these substances.

Figure 4:
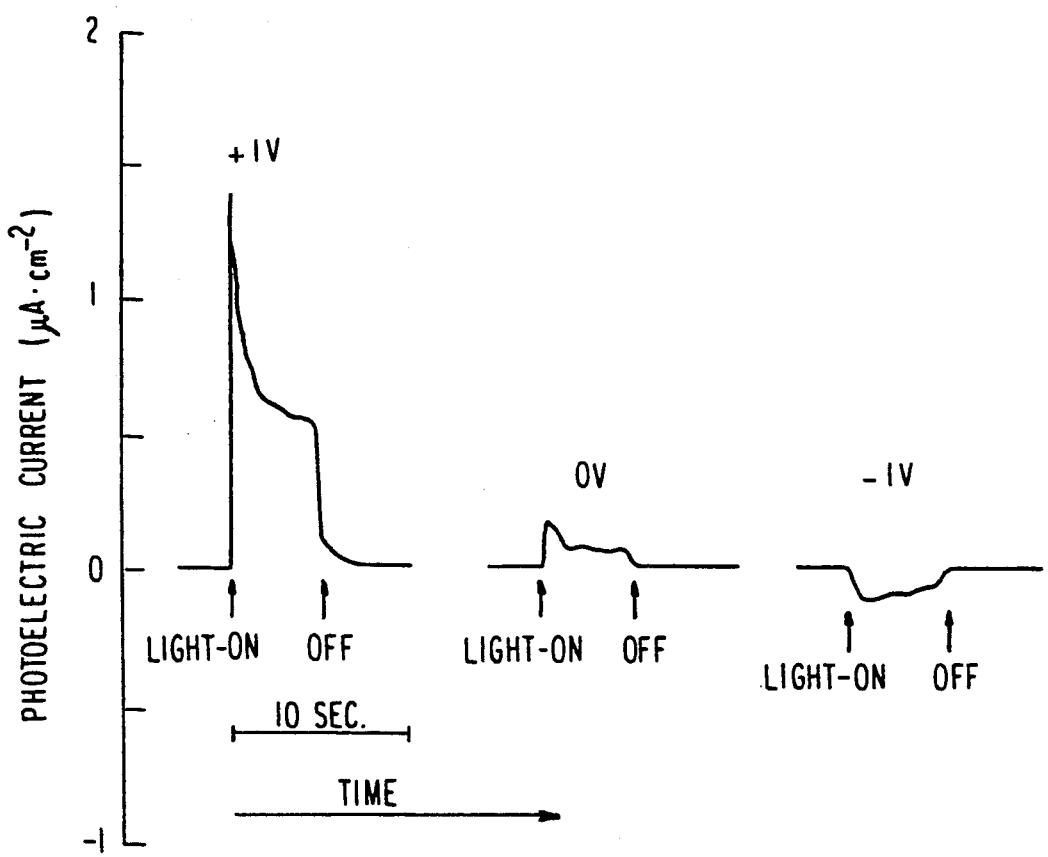
FIG. 4 is a graph showing the photoelectric response of an electronic device described in Example 1.
Figure 5:
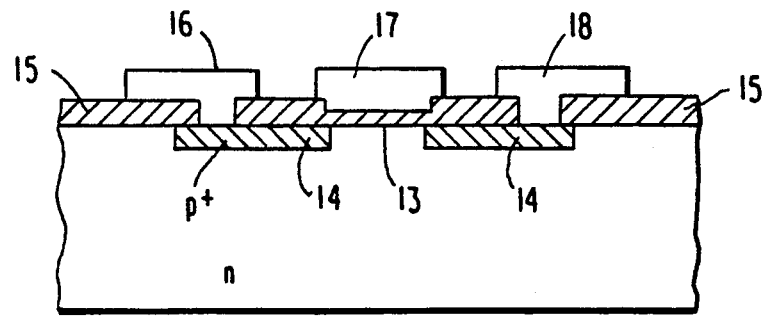
FIG. 5 is a sectional view showing the structure of a FET transistor.
Figure 6:
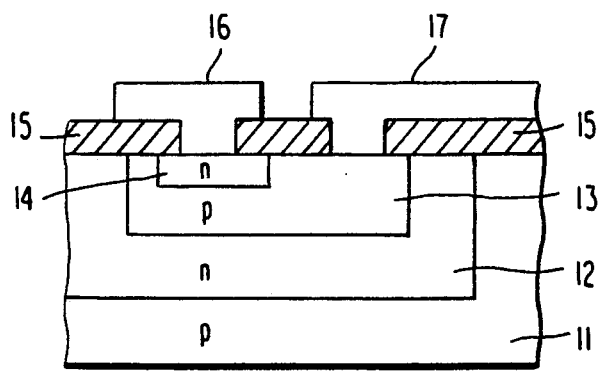
FIG. 6 is a sectional view showing the structure of a rectifier element of the conventional MOS type.
Figure 7:
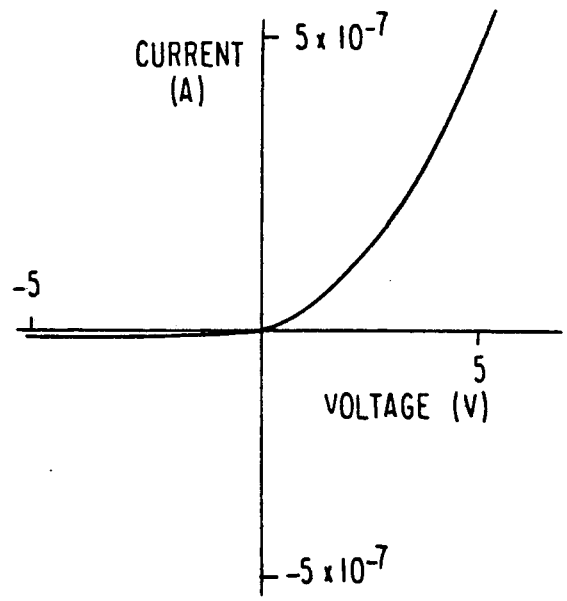
FIG. 7 is a graph showing voltage-current characteristics of Example 2.

FIG. 2 is a typical view showing a rectifier element of another embodiment of the present invention. In this embodiment, hematoporphyrin bis(trideca)yl ether) Ru(III) pyridine complex (hereinafter referred to as RuHP) is used as a molecular having a porphyrin ring and constituting a second oxidation-reduction substance film (4). The reference number (7) designates porphyrin rings. In this case, the redox potential of the first oxidation-reduction substance is approximately 600 mV, compared with that of the second oxidation-reduction substance, and thus rectifying characteristics as shown in FIG. 3 can be achieved due to the difference in redox potential between these substances. These rectifying characteristics are theoretically proved by FIG. 5. FIG. 4 shows first and second cycles of a cyclic voltammogram of electrodes wherein RuHP and DNI are accumulated on gold electrodes. In the first cycle, the oxidation peak of RuHP is apparently enlarged while no peak is observed in the oxidation-reduction position of DNI. In the second cycle, the same behaviors as those observed in the case of electrodes modified by RuHP alone are observed. These results theoretically indicate that the electron transfer from DNI to gold via RuHP can be controlled in one direction (rectifying characteristics).

Therefore a rectifying element of a hyperfine size in a molecular level can be obtained and integrated circuits of high density can be prepared by using said element.

Although the above-mentioned embodiment has shown the case where LB and monomolecular films of cytochrome c or RuHP and a monomolecular LB film of DNI are employed, these films may be replaced with monomolecular accumulated films. Further, a molecule containing an iron atom may be used as the molecule containing a porphyrin ring. Furthermore, (7,8-dimethyl-3,10-dimethylisoalloxazin-8α-yl)thiosuccinic acid or (7,8-dinonyl-3,10-dinonylisoalloxazin-8α-yl)thioacetic acid may be used as a molecule having an isoalloxazine ring.

The difference in redox potential between a porphyrin derivative and a flavin derivative may widely vary depending on the combination of these substances. When the electronic device is to be used as a rectifier element, the difference in redox potential may range from 0.05 to 1.5 V, preferably from 0.2 to 1.2 V from the viewpoint of rectifying ratio and still preferably from 0.4 to 1.0 V from the viewpoint of TURN-ON/TURN-OFF speed. Examples of a combination satisfying these requirements include: a combination of a porphyrin derivative of the formula (I) wherein m and n are each 13 and X and Y are each $P(OCH_3)_3$ (hereinafter referred to as compound P1) with a flavin derivative of the formula (IV) wherein $R_1$ and $R_2$ are each $C_6H_{19}$ and $R_3$ and $R_4$ are each $CH_3$ (hereinafter referred to as compound F1); a combination of the compound P1 with a flavin derivative of the formula (IV) wherein $R_1$ and $R_2$ are each $C_9H_{19}$, $R_3$ is $—CH_3—S—CH_2COOH$ and $R_4$ is $CH_3$ (hereinafter referred to as compound F2); a combination of the compound F1 with a porphyrin derivative of the formula (I) wherein m and n are each 13 and X and Y are each pyridine (hereinafter referred to as compound P2); and a combination of the compound P2 and the compound F2. When the redox potential difference is less than 0.05 V, rectifying characteristics cannot be substantially obtained. When it exceeds 1.5 V, on the other hand, the electron transmission speed in the predetermined direction is lowered and thus the rectifying characteristics are deteriorated.

As described above, the present invention makes it possible to reduce the size of a rectifying element to a hyperfine molecular level by constructing a rectifying region with the use of oxidation-reduction substances having a difference in redox potential from each other. By utilizing this element, a high-speed integrated circuit of high density can be obtained.

Furthermore, the present invention makes it possible to easily form a three-dimensional element, since oxidation-reduction substance films used in the present invention, which are produced by the LB method, can be easily accumulated on each other in a controlled manner, regardless of the properties of a substrate. Further, the element of the present invention can be combined with a conventional Si semiconductor and a compound semiconductor element such as GaAs so as to easily give a hybrid element.

To further illustrate the electronic device of the present invention, the following Examples will be given.

EXAMPLE 1

First, Al electrodes (2a) of 1000 Å in thickness arranged in parallel at intervals of 1 mm were formed on a substrate (1).

Then 9 molecular layers (thickness: 27.5 mN·m$^{-1}$) of a Ru-porphyrin complex (RPPH) of the formula (V):

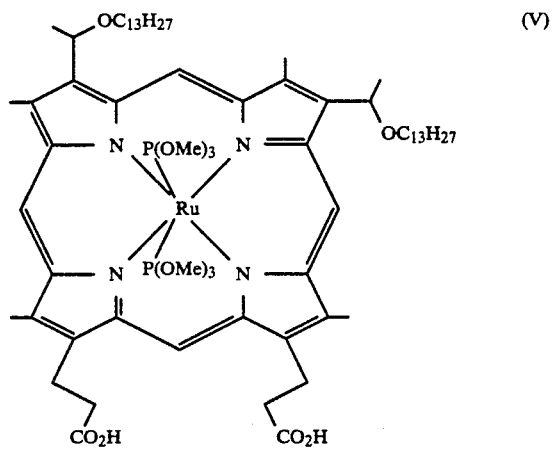

were accumulated onto said substrate so as to form a first oxidation-reduction substance film (3). In FIG. 1, this film comprises 3 layers for the purpose of abbreviation.

Next, 10 molecular layers of 3,10-dinonyl-7,8-dimethylisoalloxazine (DNI) of the formula (VI):

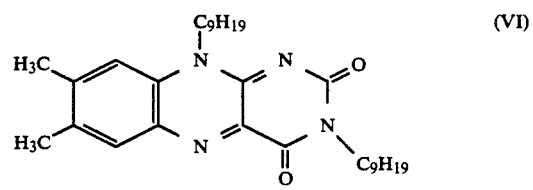

were accumulated onto the substrate comprising (1), (2a) and (3) by the LB method so as to form a second oxidation-reduction substance film (4) of 30 mN·m$^{-1}$ in film thickness. In FIG. 2, this film comprises 2 layers for the purpose of abbreviation. The second oxidation-reduction substance film (4) was accumulatedly sticked and joined on the first oxidation-reduction substance film (3).

Next, second translucent Al electrodes (2b) arranged in parallel at intervals of 1 mm (thickness: 100 Å) were formed in the vertical direction to the electrodes (2a).

The switch element thus formed was intermittently irradiated with light of 450 nm in wavelength of approximately 400 μW. FIG. 4 shows the response of the output current. The redox potential of RPPH was approximately 700 mV, compared with that of DNI, and switching characteristics were obtained due to the difference in redox potential between these substances. In this embodiment, lower electrodes (2a) were earthed, while a voltage of +1 V, 0 V or 1 V was applied to the upper translucent electrodes (2b). In the case of each voltage, a large photoelectric response was observed. When the voltage of +1 V was applied, a particularly large photoelectric response was obtained. These results indicate that a cell of this A-B type two layer structure can function as a photoswitching device.

In Example 1, a monomolecular accumulated film of a porphyrin derivative and that of a flavin derivative were used respectively as the first and second oxidation-reduction substance films. However these LB films may be each a monomolecular film. Further, one of the first and second oxidation-reduction substance films may be a LB film while another one is an oxidation-reduction substance film other than LB films. Furthermore, both of these films may be oxidation-reduction substance films other than LB films. Although the element of Example 1 has an A-B type two layer structure, those of an A-B-A type three layer structure are also available. Furthermore, the redox potential may be controlled not by photoirradiation but by the application of an electric field, as in the case of FIG. 3.

Accordingly, the present invention makes it possible to prepare a switch element which is capable of conducting an operation similar to those of conventional semiconductor switch elements (for example, p-n-p type) and yet has a hyperfine size in a molecular level. By utilizing said element, a high-speed integrated circuit of high density can be obtained. Further, the element of the present invention can function as a photoswitching element. Furthermore, it can be easily formulated into a three-dimensional element, since oxidation-reduction substance films can be easily accumulated regardless of the properties of a substrate. Furthermore, it can be combined with conventional Si semiconductors or compound semiconductor elements such as GaAs so as to easily give a hybrid element.

EXAMPLE 2

Figure 8:
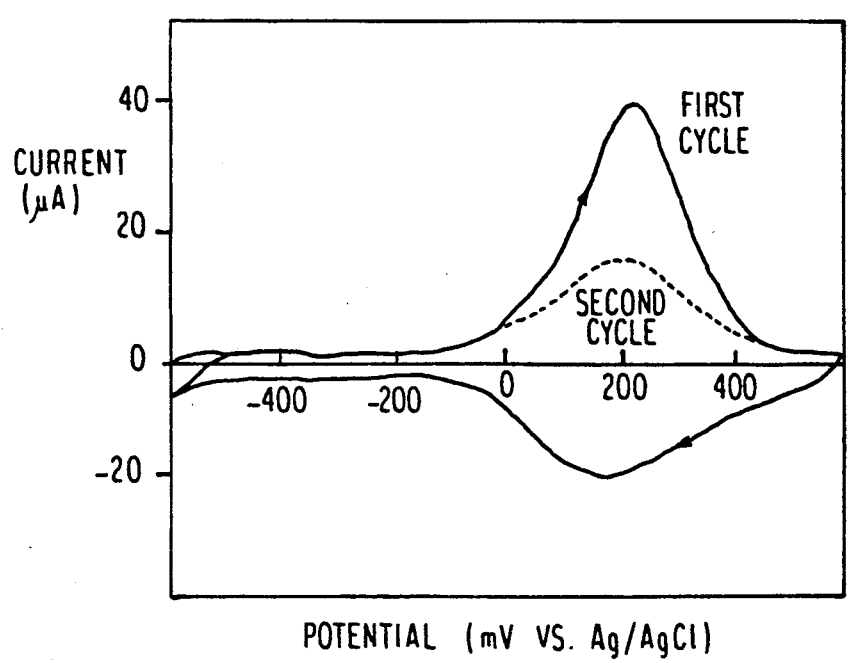
FIG. 8 is a diagram showing the first and second cycles of cyclic voltamograph of an electrode wherein RuHP and DNI are accumulated on a gold electrode.

A two-layer film of an Ru-porphyrin metal complex, employed as a porphyrin derivative, of the formula (V) in Example 1 having a thickness of 30 Å and a three layer film of 3,10-dinonyl-7,8-dimethylisoalloxazine (DNI), employed as a flavin derivative, of the following formula (VI) in Example 1 having a thickness of 45 Å were used in a rectifying region so as to give a rectifier element. The difference in redox potential was approximately 700 mV (the direction of RPPH was referred to as positive). The electrodes in the DNI side of this rectifier element was earthed and a voltage between $-5$ to $+5$ V was applied. The voltage (V)/current (I) characteristics were then examined. FIG. 8 shows the results. As FIG. 8 shows, the rectifier element of this Example showed rectifying characteristics.

Accordingly, a rectifier element of a hyperfine molecular size can be obtained. By utilizing this element, a high-speed integrated circuit of high density can be obtained.

In the example, a monomolecular accumulated film of the flavin derivative and a monomolecular accumulated film of the porphyrin derivative were respectively employed as the first and second oxidation-reduction substance films (3) and (4) so as to form a rectifying region (9). However these oxidation-reduction substance films may be monomolecular films.

While the invention has been described in detail and with reference to specific embodiments thereof, it will be apparent to one skilled in the art that various changes and modifications can be made therein without departing from the spirit and scope thereof.

What is claimed is:

1. An electronic device comprising:

a first oxidation-reduction substance film of a first oxidation-reduction substance;

a second oxidation-reduction substance film of a second oxidation-reduction substance having a redox potential different from that of said first oxidation-reduction substance and being accumulatedly contacted and joined on said first oxidation-reduction substance film; and a first electrode electrically connected to said first oxidation-reduction substance film and a second electrode electrically connected to said second oxidation-reduction substance film;

wherein said first oxidation-reduction substance is composed of one of a flavin derivative and a porphyrin derivative while said second oxidation-reduction substance is composed of another one so as to provide transistor characteristics or switching characteristics by utilizing the difference in redox potential between said first and second oxidation-reduction substances.

2. An electronic device as claimed in claim 1, wherein the device is a switch element.

3. An electronic device as claimed in claim 1, wherein the device is a rectifier element.

4. An electronic device as claimed in claim 1, wherein said flavin derivative is a compound represented by the following general formula (I):

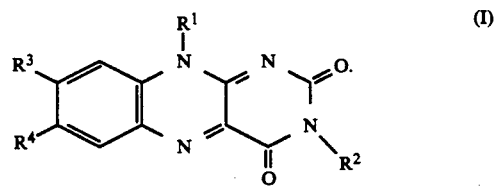

wherein $R^1$ and $R^2$ are each a hydrogen atom or an alkyl group selected from among the following combinations:

(i) $R^1$ is a hydrogen atom or an alkyl group having 1 to 5 carbon atoms and $R^2$ is an alkyl group having 15 to 20 carbon atoms;

(ii) $R^1$ is an alkyl group having 6 to 20 carbon atoms and $R^2$ is an alkyl group having 6 to 20 carbon atoms; and (iii) $R^1$ is an alkyl group having 15 to 20 carbon atoms and $R^2$ is a hydrogen atom or an alkyl group having 1 to 5 carbon atoms; and $R^3$ and $R^4$ represent each a hydrogen atom, an alkyl group having 1 to 5 carbon atoms, a substituent including a carbonyl group, a methylthioacetate group or a methylthiosuccinate group.

5. An electronic device as claimed in claim 1, wherein said porphyrin derivative is a porphyrin metal complex represented by the following general formula (II), (III) or (IV):

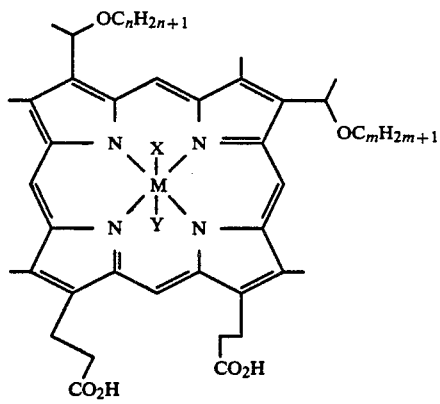
(II)

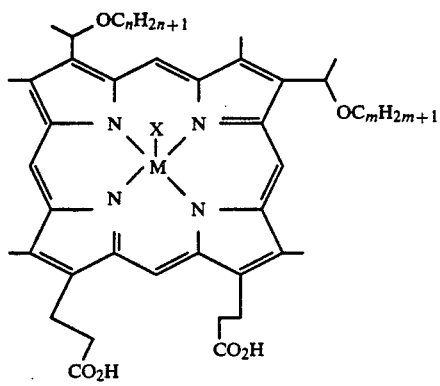
(III)

or

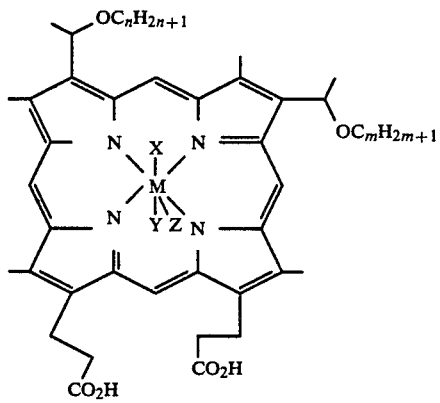
(IV)

wherein M represents a Fe or Ru atom; X, Y and Z are each a ligand for M which can have the structure (II), (III) or (IV) depending on the type and valency of M and each represents a halogen atom, CO, —OCOCH$_3$, pyridine, imidazole, P(OR)$_3$ or PR$_3$ wherein R is a lower alkyl group having 1 to 4 carbon atoms; X and Y may be either the same or different from each other; m and n are each an integer of from 5 to 20 and m and n may be either the same or different from each other: or an alkali metal salt thereof.

6. An electronic device as claimed in claim 1, wherein one of the first and second oxidation-reduction substance films is a monomolecular film or a monomolecular accumulated film composed of cytochrome c, which is a redox protein capable of transmitting electrons in a predetermined direction, or a molecule having a porphyrin ring, and another one is a monomolecular film or a monomolecular accumulated film composed of a molecule having an isoalloxazine ring and rectifying characteristics are attained by utilizing the difference in redox potential between these oxidation-reduction substances.

7. An electron device as claimed in claim 1, wherein said flavin derivative is a compound represented by the following formula (I):

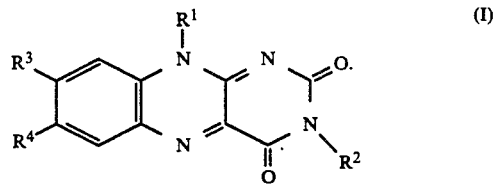

wherein R$^1$ and R$^2$ are each a hydrogen atom or an alkyl group selected from among the following combinations:

(i) R$^1$ is a hydrogen atom or an alkyl group having 1 to 5 carbon atoms and R$^2$ is an alkyl group having 15 to 20 carbon atoms;

(ii) R$^1$ is an alkyl group having 6 to 20 carbon atoms and R$^2$ is an alkyl group having 6 to 20 carbon atoms; and (iii) R$^1$ is an alkyl group having 15 to 20 carbon atoms and R$^2$ is a hydrogen atom or an alkyl group having 1 to 5 carbon atoms; and R$^3$ and R$^4$ represent each a hydrogen atom, an alkyl group having 1 to 5 carbon atoms, a substituent including a carbonyl group, a methylthioacetate group or a methylthiosuccinate group.

8. An electronic device as claimed in claim 1, wherein said porphyrin derivative is a porphyrin metal complex represented by the following formula (II), (III) or (IV):

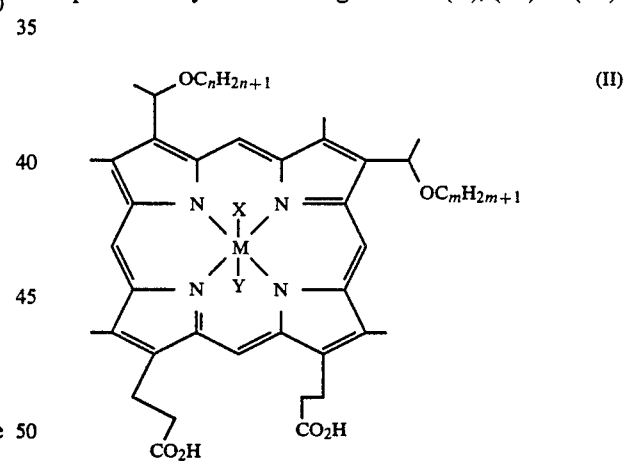
(II)

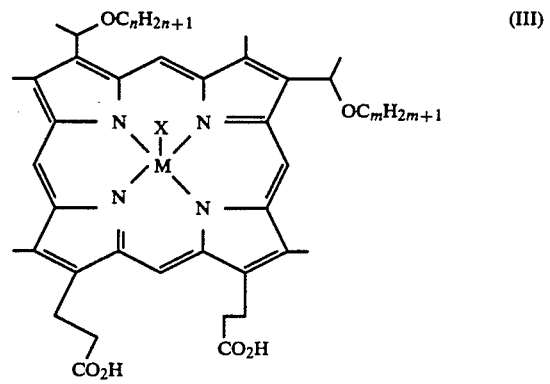
(III)

or

-continued

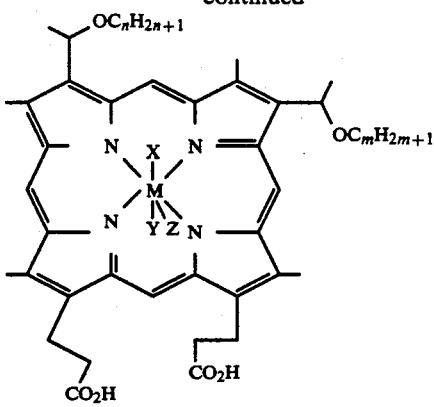

(IV)

wherein M represents a Fe or Ru atom; X, Y and Z are each a ligand for M which can have the structure (II), (III) or (IV) depending on the type and valency of M and each represents a halogen atom, CO, —OCOCH$_3$, pyridine, imidazole, P(OR)$_3$ or PR$_3$ wherein R is a lower alkyl group having 1 to 4 carbon atoms; X and Y may be either the same or different from each other; m and n are each an integer of from 5 to 20 and m and n may be either the same or different from each other: or an alkali metal salt thereof.

9. An electronic device as claimed in claim 1, wherein one of the first an second oxidation-reduction substance films is a monomolecular film or a monomolecular accumulated film composed of cytochrome c, which is a redox protein capable of transmitting electrons in a predetermined direction, or a molecule having a porphyrin ring, and another one is a monomolecular film or a monomolecular accumulated film composed of a molecule having an isoalloxazine ring and rectifying characteristics are attained by utilizing the difference in redox potential between these oxidation-reduction substances.

10. An electronic device as claimed in claim 1, which is a switch element.

11. An electronic device as claimed in claim 1, which is a rectifier element.

12. An electronic device comprising:
a first oxidation-reduction substance film of a first oxidation-reduction substance;
a second oxidation-reduction substance film of a second oxidation-reduction substance having a redox potential different from that of said first oxidation-reduction substance and being accumulatedly contacted and joined on said first oxidation-reduction substance film;
a third oxidation-reduction substance film of a third oxidation-reduction substance having a redox potential different from that of said second oxidation-reduction substance and accumulatedly sticked and joined on said second oxidation-reduction substance film;
a first electrode electrically connected to said first oxidation-reduction substance film and a third electrode electrically connected to said third oxidation-reduction substance film; and
a second electrode for exerting electrical effects on said second oxidation-reduction substance film;
wherein said first oxidation-reduction substance is composed of a flavin derivative, said second oxidation-reduction substance is composed of a porphyrin derivative and said third oxidation-reduction substance is composed of a flavin derivative;
or said first oxidation-reduction substance is composed of a porphyrin derivative, said second oxidation-reduction substance is composed of a flavin derivative and said third oxidation-reduction substance is composed of a porphyrin derivative so as to provide transistor characteristics or switching characteristics by utilizing the difference in redox potential among said oxidation-reduction substances.

* * * * *